(12) United States Patent
Zhu

(10) Patent No.: US 12,550,717 B2
(45) Date of Patent: Feb. 10, 2026

(54) METALIZED LAMINATE HAVING INTERCONNECTION WIRES AND ELECTRONIC DEVICE HAVING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 920 days.

(21) Appl. No.: 17/756,939

(22) PCT Filed: Oct. 16, 2020

(86) PCT No.: PCT/CN2020/121338
§ 371 (c)(1),
(2) Date: Jun. 6, 2022

(87) PCT Pub. No.: WO2021/109722
PCT Pub. Date: Jun. 10, 2021

(65) Prior Publication Data
US 2023/0005839 A1 Jan. 5, 2023

(30) Foreign Application Priority Data
Dec. 6, 2019 (CN) .......................... 201911254541.6

(51) Int. Cl.
*H01L 23/528* (2006.01)
*H01L 21/768* (2006.01)
(Continued)

(52) U.S. Cl.
CPC ...... *H01L 23/5283* (2013.01); *H01L 21/7682* (2013.01); *H01L 21/76837* (2013.01);
(Continued)

(58) Field of Classification Search
CPC ............. H01L 23/5283; H01L 23/5226; H01L 23/53242; H01L 23/53257; H10D 84/038; H10D 84/0149
See application file for complete search history.

(56) References Cited

U.S. PATENT DOCUMENTS 4,536,951 A 8/1985 Rhodes et al.
4,670,091 A 6/1987 Thomas et al.
(Continued)

FOREIGN PATENT DOCUMENTS

CN 1343372 A 4/2002
CN 101425500 A 5/2009
(Continued)

OTHER PUBLICATIONS

Office Action issued in Chinese Application No. 201911254541.6, mailed on Aug. 17, 2022 (25 pages).
(Continued)

*Primary Examiner* — Michael Jung
(74) *Attorney, Agent, or Firm* — Osha Bergman Watanabe & Burton LLP

(57) ABSTRACT

A metallic stack and a preparing method therefor, and an electronic device including the metallic stack. The metallic stack includes at least one interconnection wire layer and at least one via layer alternately arranged on a substrate. At least one pair of interconnection wire layer and via layer in the metallic stack includes interconnection wires in the interconnection wire layer and conductive vias in the via layer, wherein the interconnection wire layer is closer to the substrate than the via layer. At least a part of the interconnection wires is integrated with the conductive vias on the at least a part of the interconnection wires.

15 Claims, 19 Drawing Sheets

(51) Int. Cl.
  *H01L 23/522* (2006.01)
  *H01L 23/532* (2006.01)
  *H10D 84/01* (2025.01)
  *H10D 84/03* (2025.01)
(52) U.S. Cl.
  CPC .... *H01L 23/5226* (2013.01); *H01L 23/53242* (2013.01); *H01L 23/53257* (2013.01); *H10D 84/0149* (2025.01); *H10D 84/038* (2025.01)

(56) References Cited

U.S. PATENT DOCUMENTS

| | | | |
|---|---|---|---|
| 5,693,568 | A | 12/1997 | Liu et al. |
| 6,444,565 | B1 | 9/2002 | Feild et al. |
| 10,224,242 | B1 * | 3/2019 | Yang ................. H01L 23/5283 |
| 2002/0155693 | A1 | 10/2002 | Hong et al. |
| 2010/0193964 | A1 * | 8/2010 | Farooq ............... H01L 25/0657 257/E21.585 |
| 2011/0193197 | A1 * | 8/2011 | Farooq ............... H01L 23/5226 257/E21.705 |
| 2012/0225551 | A1 | 9/2012 | Blatchford |
| 2014/0131883 | A1 | 5/2014 | Huang et al. |
| 2015/0056800 | A1 | 2/2015 | Mebarki et al. |
| 2020/0152623 | A1 * | 5/2020 | Kocon ................. H10D 30/603 |
| 2020/0152788 | A1 * | 5/2020 | Kocon ............. H01L 21/76202 |
| 2020/0403071 | A1 * | 12/2020 | Tadepalli ................ H01L 22/20 |

FOREIGN PATENT DOCUMENTS

| | | |
|---|---|---|
| CN | 102881638 A | 1/2013 |
| CN | 103871964 A | 6/2014 |
| CN | 104752399 A | 7/2015 |
| CN | 105679742 A | 6/2016 |
| CN | 108807339 A | 11/2018 |
| CN | 110137134 A | 8/2019 |
| CN | 110993583 A | 4/2020 |
| EP | 0175604 A2 | 3/1986 |
| TW | 201530692 A | 8/2015 |

OTHER PUBLICATIONS

Office Action issued in Chinese Application No. 201911254541.6, mailed on Feb. 9, 2021 (11 pages).
Office Action issued in Chinese Application No. 201911254541.6, mailed on Aug. 20, 2021 (13 pages).
Final Office Action issued in Chinese Application No. 201911254541.6, mailed on Apr. 7, 2022 (7 pages).
International Search Report and English translation issued in Chinese Application No. PCT/CN2020/121338, mailed on Jan. 22, 2021 (8 pages).
Written Opinion issued in Chinese Application No. PCT/CN2020/121338, mailed on Jan. 22, 2021 (5 pages).

* cited by examiner

METALIZED LAMINATE HAVING INTERCONNECTION WIRES AND ELECTRONIC DEVICE HAVING THE SAME

CROSS-REFERENCE TO RELATED APPLICATION

This application claims the priority of Chinese Patent Application No. 201911254541.6 filed on Dec. 6, 2019, entitled "METALLIC STACK, PREPARING METHOD THEREFOR, AND ELECTRONIC DEVICE INCLUDING METALLIC STACK", the contents of which are incorporated herein by reference.

TECHNICAL FIELD

The present disclosure relates to the field of semiconductors, and more particularly, to a metallic stack, a preparing method therefor, and an electronic device including metallic stack.

BACKGROUND

As semiconductor devices continue to be miniaturized, it becomes increasingly difficult to prepare high-density interconnect structures due to the need for extremely fine metal wires (meaning small grain size, excessive barrier thickness and thus large resistance) and extremely small line spacing (meaning misaligned, difficult to fill contact holes). Additionally, it is difficult to align metal wires with conductive vias, which may lead to short or open failures in the integrated circuit (IC) and thus increase the manufacturing cost of the IC.

SUMMARY

According to one aspect of the present disclosure, a metallic stack is provided, including at least one interconnection wire layer and at least one via layer alternately arranged on a substrate. At least one pair of interconnection wire layer and via layer which are adjacent in the metallic stack include: an interconnection wire in the interconnection wire layer; and a conductive via in the via layer, wherein the interconnection wire layer is closer to the substrate than the via layer. At least a part of the interconnection wire is integrated with the conductive via on the at least a part of the interconnection wire.

According to another aspect of the present disclosure, a method of preparing a metallic stack is provided. The metallic stack includes at least one interconnection wire layer and at least one via layer alternately arranged. The method includes the following steps for forming at least one pair of interconnection wire layer and via layer which are adjacent in the metallic stack: forming a metal layer on an underlying layer; patterning the metal layer into an interconnection pattern; and thinning a thickness of a first part of the interconnection pattern to form an interconnection wire in the interconnection wire layer, wherein a second part other than the first part of the interconnection pattern forms a conductive via in the via layer.

According to another aspect of the present disclosure, an electronic device including the metallic stack as described above is provided.

BRIEF DESCRIPTION OF THE DRAWINGS

The above and other objects, features and advantages of the present disclosure will become more apparent from the following description of embodiments of the present disclosure with reference to accompanying drawings, in which:

FIGS. 1 to 16 schematically illustrate some stages in the flow of preparing a metallic stack according to the embodiments of the present disclosure, wherein FIGS. 3(a), 7, 8(a), 9, 10(a), 11(a), and 14(a) are top views, and FIGS. 1, 2, 10(b), 11(b), 12 (a), 14(b), 15(a), 15(b), and 16 are cross-sectional views along line AA'.

Throughout the drawings, the same or similar reference numbers refer to the same or similar parts.

DETAILED DESCRIPTION OF EMBODIMENTS

Figure 1:
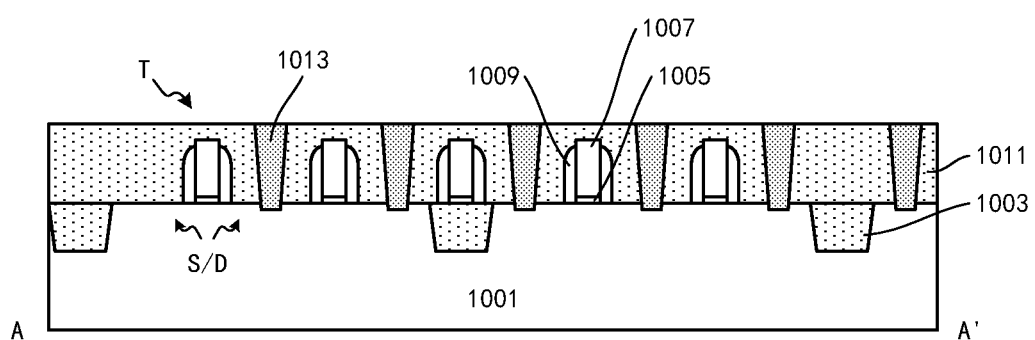

Embodiments of the present disclosure will be described below with reference to accompanying drawings. It should be understood, however, that these descriptions are merely exemplary, and are not intended to limit the scope of the present disclosure. Further, in the following description, descriptions of well-known structures and techniques are omitted to avoid unnecessarily obscuring concepts of the present disclosure.

Various structural schematic diagrams according to the embodiments of the present disclosure are shown in the accompanying drawings. The drawings are not to scale, some details have been exaggerated for clarity, and some details may be omitted. Shapes of various regions and layers shown in the drawings, as well as their relative sizes and positional relationships are only exemplary, and may vary in practice due to preparing tolerances or technical limitations, and regions/layers having different shapes, sizes and relative positions may be additionally designed by those skilled in the art as desired.

In the context of the present disclosure, when a layer/element is referred to as being "on" another layer/element, it may be directly on the another layer/element or there may be intervening layers/elements. In addition, if a layer/element is "on" another layer/element in one orientation, the layer/element may be "below" the another layer/element when the orientation is reversed.

Embodiments of the present disclosure provide a method of preparing a metallic stack. In the conventional technique, an interlayer dielectric layer is formed first, then trenches or holes are formed in the interlayer dielectric layer, and the trenches or holes are filled with a conductive material to form interconnection wires or vias. According to embodiments of the present disclosure, a metal pattern is first formed on an underlying layer, for example, on a substrate on which some devices have been formed or a lower layer in the metallic stack, then gaps of the metal pattern is filled with a dielectric material to form the interlayer dielectric layer. The metal pattern may be formed by photolithography. In this way, a line width and a spacing of interconnection wires as well as a critical dimension (CD) and a spacing of vias may be determined by the line width or CD and spacing of lithography, thereby reducing the line width or CD and spacing, and thus increasing the integration density. In addition, difficulties of metal filling in the conventional technique are avoided. Also, since a filling process is not used, metal materials such as ruthenium (Ru), molybdenum (Mo), rhodium (Rh), platinum (Pt), iridium (Ir), nickel (Ni), cobalt (Co), or chromium (Cr), may be used, so that the use of diffusion barriers may be eliminated.

Moreover, in the conventional technique, the trenches or holes formed by etching have a shape tapered from top to bottom, and thus the interconnection wires or the conductive vias formed therein have a corresponding shape. In contrast, according to the embodiments of the present disclosure, the interconnection wires or the conductive vias may be directly obtained by photolithography, and thus may have a shape tapered from bottom to top.

According to the embodiments of the present disclosure, a pair of interconnection wire layers and via layers adjacent to each other may be formed together. For example, a metal layer may be formed on the underlying layer, and a thickness of the metal layer may correspond to a sum of thicknesses of both the interconnection wire layer and the via layer. The metal layer may be formed over the entire area where the metallic stack needs to be formed, for example, over substantially the entire surface of the underlying layer. The metal layer may be patterned, for example, by photolithography, into an interconnection pattern, which may correspond to or be the layout of interconnection wires in the interconnection wire layer. A thickness of a first part of the interconnection pattern may be thinned (and possibly cut at certain areas) to form interconnection wires. A second part (which may not be substantially thinned in thickness) of the interconnection pattern other than the first part may form conductive vias in the via layer. Thus, the interconnection wires and the conductive vias on the interconnection wires may be integrated with each other and self-aligned with each other.

The metallic stack may include a plurality of such interconnection wires and via layers, at least some or all of the interconnection wires and via layers may be prepared in this way.

According to the embodiments of the present disclosure, the interconnection pattern may include a series of metal wires. These metal wires may have the same pattern as the layout of the interconnection wires in the interconnection wire layer. That is, the metal layer may be patterned according to the layout of the interconnection wires. Alternatively, the interconnection pattern may have a pattern in which the metal wires extend according to the layout of the interconnection wires, but the metal wires corresponding to separate interconnection wires opposite to each other may extend continuously. In this case, forming metal wires extending in the same direction is advantageous for patterning. This layout, in conjunction with metal wires in another interconnection wire layer extending in another direction that intersects (e.g., orthogonal to) this direction, enables various interconnect wirings. For example, in the metallic stack, an interconnection wire layer with interconnection wires extending in a first direction and an interconnection wire layer with interconnection wires extending in a second direction orthogonal to the first direction may alternate in the vertical direction. After the first part of the interconnection pattern is thinned, the metal wires may be cut at predetermined areas according to the layout of the interconnection wires, so as to realize the separation between different interconnection wires.

In the above preparing process, after the metal wires are formed and the first part of the metal wires is thinned, gaps are formed between the metal wires due to the thinning, and a dielectric material may be filled into the gaps to form an interlayer dielectric layer. As the gaps between the metal wires are small, hollows or voids may be formed in the filled dielectric material. Such hollows or voids may be helpful to reducing capacitance. Positions of the hollows or voids may be adjusted by a deposition-etch-deposition method, as described below. In addition, the filled dielectric materials may be the same or different.

According to the above-described method, a metallic stack according to the embodiments of the present disclosure may be obtained, wherein at least a part of the interconnection wires in at least one interconnection wire layer and the conductive vias thereon are integral with each other. In a conventional dual damascene process, the interconnection wires and the conductive vias below the interconnection wires may be formed together, and thus they may be integrated with each other. In contrast, according to embodiments of the present disclosure, the interconnection wires and the conductive vias above the interconnection wires may be formed together, and thus they may be integrated with each other.

As described above, the interconnection wires and the conductive vias above the interconnection wires may be obtained from the same metal layer by photolithography, so sidewalls of the conductive vias may not exceed sidewalls of the underlying interconnection wires.

The present disclosure may be presented in various forms, some examples of which will be described below. In the following description, the selection of various materials is involved. The selection of materials takes into account etch selectivity in addition to their function, for example, semiconductor materials for forming active regions, dielectric materials for forming electrical isolation, and conductive materials for forming interconnection wires and conductive vias. In the following description, the desired etch selectivity may or may not be indicated. It should be understood to those skilled in the art that when it is mentioned below that a certain material layer is etched, if it is not mentioned that other layers are also etched or the drawings do not show that other layers are also etched, then such etching may be selective, and the material layer may have etch selectivity relative to other layers exposed to the same etch recipe.

FIG. 1 to FIG. 16 schematically illustrate some stages in a flow of preparing a metallic stack according to embodiments of the present disclosure.

As shown in FIG. 1, a substrate 1001 is provided. The substrate 1001 may be various forms of substrates, including but not limited to bulk semiconductor material substrates such as bulk Si substrates, semiconductor-on-insulator (SOI) substrates, compound semiconductor substrates such as SiGe substrates, and the like. The following description will be made by taking a bulk Si substrate as an example.

In substrate 1001, active regions may be defined by an isolation 1003, such as shallow trench isolation (STI). For example, the isolation 1003 may surround each active region. On each active region, semiconductor devices T, such as metal oxide semiconductor field effect transistors (MOSFETs), fin field effect transistors (FinFETs), nanowire field effect transistors, etc., may be formed. The semiconductor devices T may have a gate stack including a gate dielectric layer 1005 and a gate electrode layer 1007, and source/drain regions S/D formed on both sides of the gate stack in the active region. On sidewalls of the gate stack, gate spacers 1009 may be formed. The semiconductor devices T may be a planar device such as a MOSFET or a three-dimensional device such as a FinFET. In the case of FinFET, the active region may be formed in the form of fins that protrude relative to the substrate surface.

An interlayer dielectric layer 1011 such as oxide (e.g., silicon oxide) may be formed on the substrate 1001 to cover various semiconductor devices T formed on the substrate

1001. In addition, in the interlayer dielectric layer 1011, a contact part 1013 connected to each semiconductor device T may be formed. In FIG. 1, only the contact parts connected to the source/drain regions S/D are shown, but the contact parts connected to the gate electrode layer 1007 may also be included (for example, referring to FIG. 3(*b*)).

Afterwards, an interconnect structure or a metallic stack may be prepared on the substrate 1001.

Figure 2:
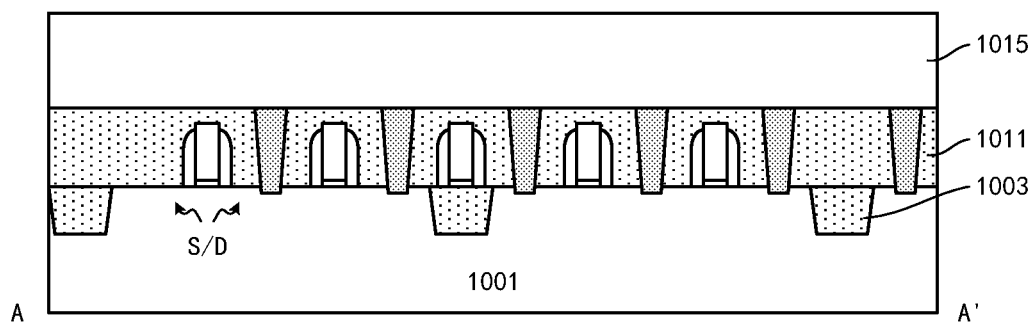
Figure 3A:
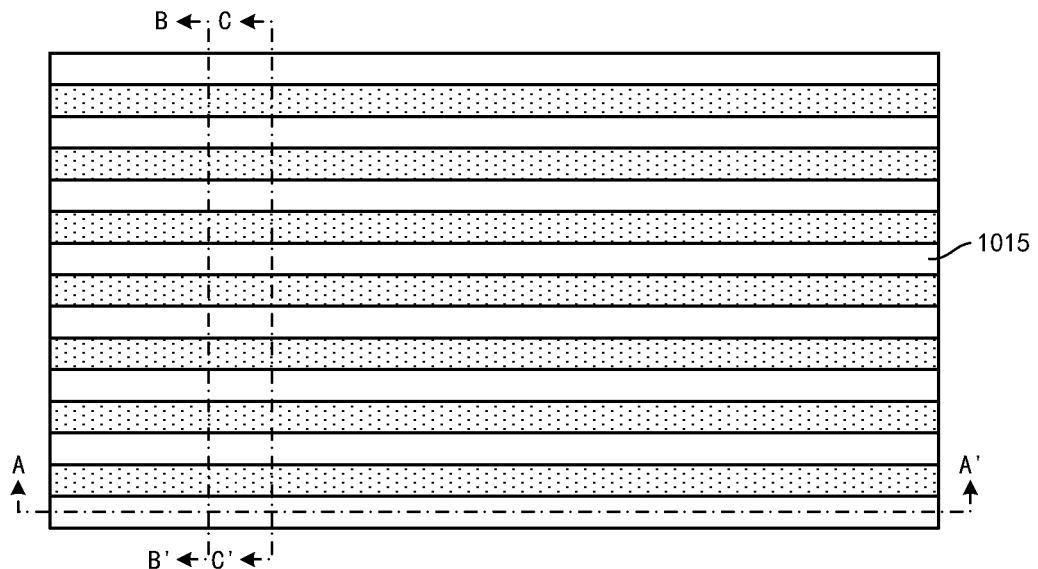
Figure 3B:
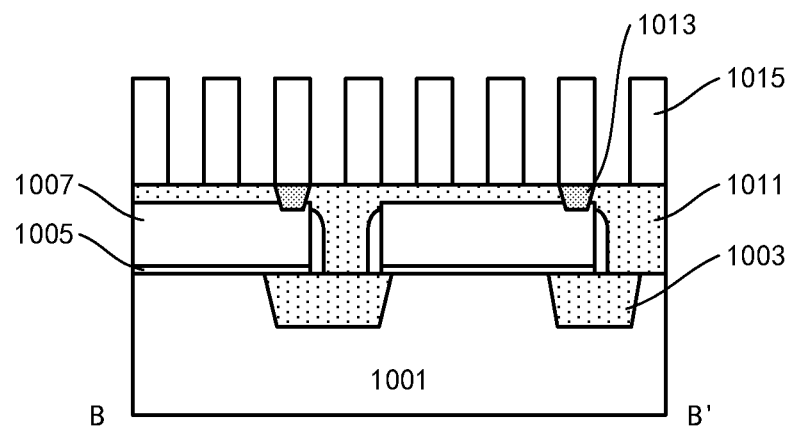
FIGS. 3(b), 4(a), 5(a), 8(b), 10(c), 11(c), 12(b), 13(a), and 14(c) are cross-sectional views along line BB', FIGS. 3(c), 4(b), 5(b), 8 (c), 10(d), 11(d), 12(c), 13(b), and 14(d) are cross-sectional views along line CC'.
Figure 3C:
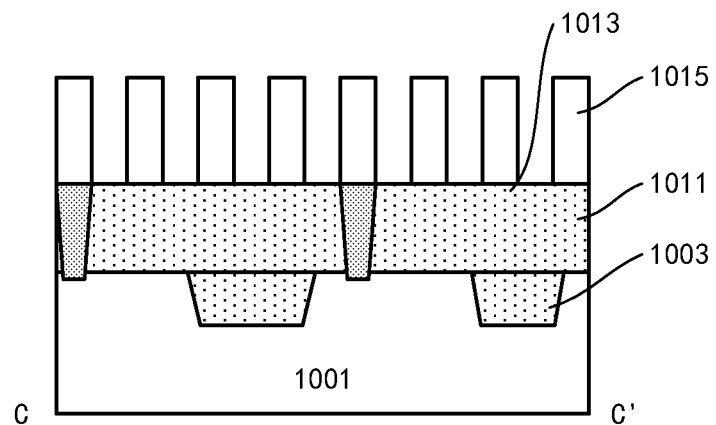

As shown in FIG. 2, a metal layer 1015 may be formed on the interlayer dielectric layer 1011 by, for example, deposition such as physical vapor deposition (PVD), chemical vapor deposition (CVD), atomic layer deposition (ALD), or the like. For example, the metal layer 1015 may include a conductive metal such as ruthenium (Ru), molybdenum (Mo), rhodium (Rh), platinum (Pt), iridium (Ir), nickel (Ni), cobalt (Co), or chromium (Cr). The metal layer 1015 may have a thickness for both the first interconnection wire layer and the first via layer in the metallic stack, for example, that is about 10-200 nm.

According to embodiments of the present disclosure, the Ru source may be purified in the following manner to obtain high-purity Ru metal. A gas stream including ozone ($O_3$) may be introduced into one or more reaction chambers in contact with the Ru source to form ruthenium tetroxide ($RuO_4$) which is gaseous under the reaction condition. The ruthenium tetroxide, unreacted ozone and remnants of gas stream may be introduced into a collection chamber where the gaseous ruthenium tetroxide may be reduced to a ruthenium dioxide ($RuO_2$) layer on the semiconductor substrate. The deposited ruthenium dioxide may then be reduced by using, for example, hydrogen to produce high purity Ru metal. Additionally, the deposited Ru metal layer may be etched and patterned by using ozone as an etching gas.

As shown in FIGS. 3(*a*)-3(*c*), the metal layer 1015 may be patterned into a series of metal wires. The patterning may be performed by a photolithography process, such as spacer pattern transfer lithography or extreme ultraviolet (EUV) lithography. In photolithography, reactive ion etching (RIE) may be employed, and RIE may stop at the interlayer dielectric layer 1011 (or the contact parts 1013 therein) under the metal layer 1015. The spacing between the metal wires may define the spacing between the interconnection wires in the first interconnection wire layer, for example, about 5-150 nm. In addition, in order to prevent the density of the patterns in the same layer from fluctuating too much in different regions, for example, dummy metal wires may be formed so that the metal wires are arranged at an approximately uniform spacing. The line width of the metal wires may define the line width of the interconnection wires in the first interconnection wire layer, for example, about 5-100 nm. Additionally, at least a part of the metal wires may contact and be electrically connected to the underlying contact parts 1013.

In this example, the formed metal wires extend substantially parallelly in the first direction (the horizontal direction on the paper in FIG. 3(*a*)), and may match subsequently-formed metal wires that extend in a second direction intersecting with (e.g., perpendicular to) the first direction, so as to realize various interconnection wirings. However, the present disclosure is not limited thereto. For example, different metal wires may extend in different directions, and the same metal wire may extend in a zigzag manner.

Figure 4A:
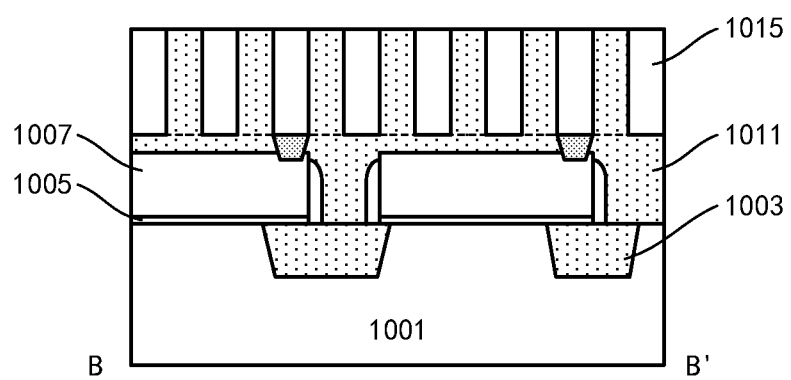
Figure 4B:
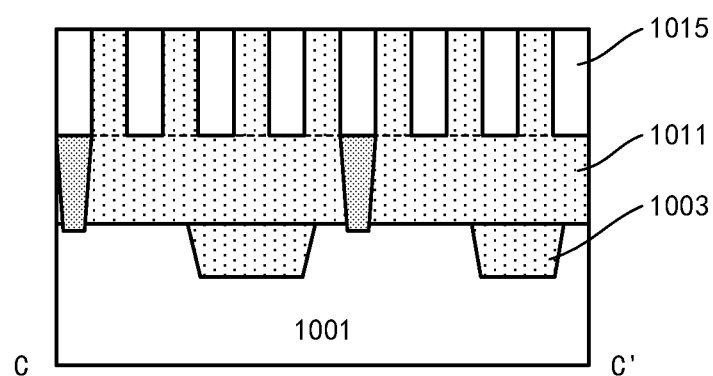

As shown in FIGS. 4(*a*) and 4 (*b*), another interlayer dielectric layer may be formed on the interlayer dielectric layer 1011 to fill the gaps between the metal wires 1015. Another interlayer dielectric layer may include dielectric materials such as silicon oxide, silicon oxycarbide, other low-k dielectric materials, and the like. Here, the another interlayer dielectric layer and the previous interlayer dielectric layer 1011 may include the same material, and thus may be shown as a whole indicated by 1011, and a possible boundary between them is schematically shown with a dotted line. Of course, they may also include different materials.

A dielectric material may be deposited to cover the metal wires 1015, for example, through CVD or ALD process, then etched back or planarized (e.g., by chemical mechanical polishing (CMP)) with stopping at a top surface of the metal wires 1015, so as to form the another interlayer dielectric layer. The etching may use atomic layer etch (ALE) to achieve good process control.

Figure 5A:
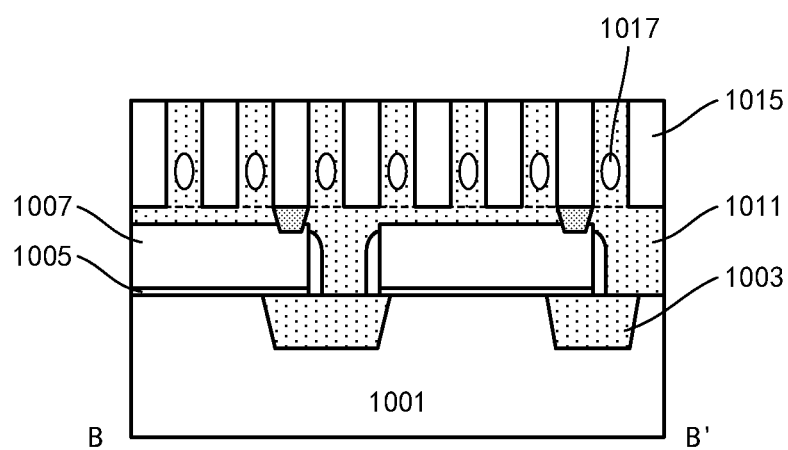
Figure 5B:
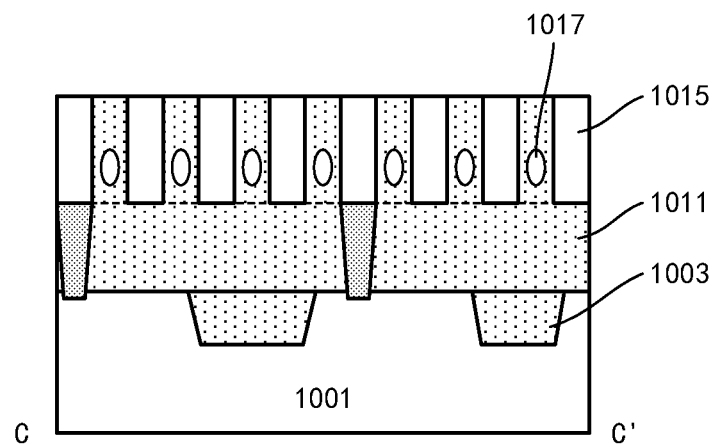

In the example shown in FIGS. 4(*a*) and 4 (*b*), the deposited dielectric material completely fills the gaps between the metal wires 1015. However, the present disclosure is not limited thereto. As shown in FIGS. 5(*a*) and 5(*b*), due to the small gap between the metal wires 1015, when depositing the dielectric material, for example, when a CVD process is used, hollows or voids may be formed between the metal wires 1015. Such hollows or voids 1017 is helpful to reducing capacitance between metal wires.

According to the embodiments of the present disclosure, a position of the hollows or voids 1017 in the vertical direction may be adjusted by adjusting the deposition process.

Figure 6A:
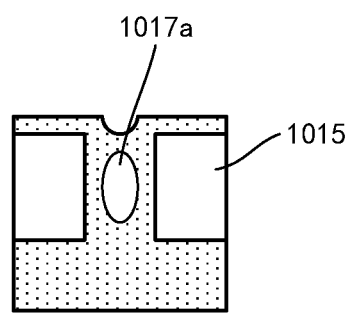
FIGS. 6(a) to 6(c) are enlarged views of an area near metal wires in a cross section along line BB' or CC'.
Figure 6B:
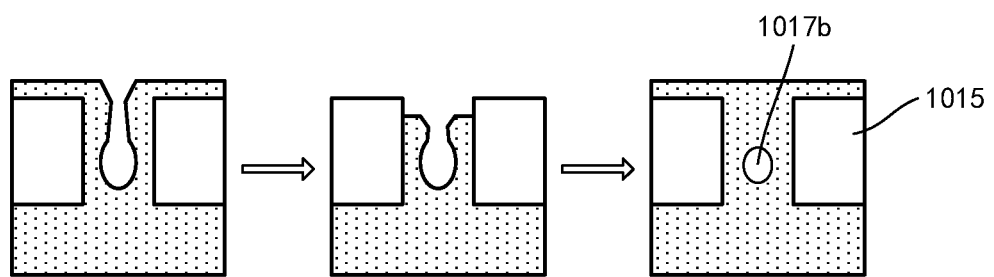
Figure 6C:
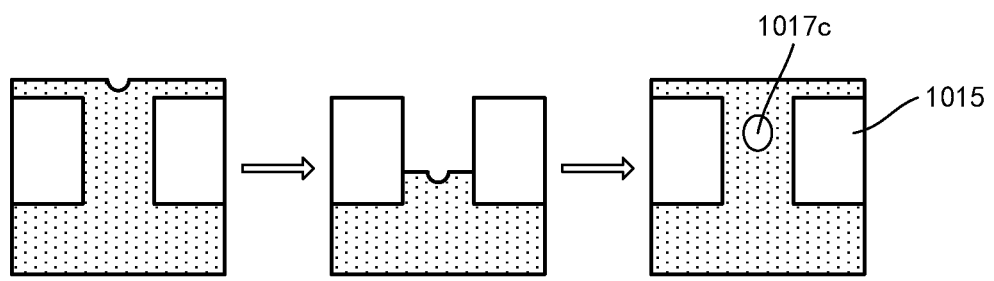

For example, as shown in FIG. 6(*a*), a dielectric material may be deposited into the gaps between the metal wires 1015 until the dielectric material closes the tops of the gaps. During deposition, multiple layers (of the same or different materials) may be used. In this case, the formed hollows or voids 1017*a* may be located approximately in the middle of the gaps in the vertical direction.

Alternatively, as shown in FIG. 6(*b*), a dielectric material may be deposited into the gaps between the metal wires 1015 without closing the tops of the gaps. The deposited dielectric material may then be selectively etched, such as by RIE, leaving a part thereof at the bottom of the gaps, thereby increasing the opening in the dielectric material. Next, the dielectric material may continue to be deposited until the dielectric material closes the top of the gaps. The dielectric materials deposited two times may be the same or different. Of course, this deposition-etch-deposition process may be repeated multiple times. In this case, the formed hollows or voids 1017*b* may be located at the lower part of the gaps in the vertical direction.

Alternatively, as shown in FIG. 6(*c*), a dielectric material may be deposited into the gaps between the metal wires 1015 until the dielectric material may completely fill the gaps. The deposited dielectric material may then be selectively etched, such as by RIE, leaving a part thereof at the bottom of the gaps. Next, the dielectric material may continue to be deposited until the dielectric material closes the top of the gaps. The deposited dielectric materials deposited two times may be the same or different. Of course, this deposition-etch-deposition process may be repeated multiple times. In this case, the formed hollows or voids 1017*c* may be located at the upper part of the gaps in the vertical direction.

As described above, by alternately performing deposition and etching, the positions of hollows or voids in the gaps between the metal wires may be adjusted in the up-down direction.

Currently, in the first via layer, the pattern of the metal layer is the same as that in the first interconnection wire layer (i.e., the above-described metal wire pattern). The metal layer (i.e., metal wires) may be further patterned in the first via layer to form a via pattern.

Figure 7:
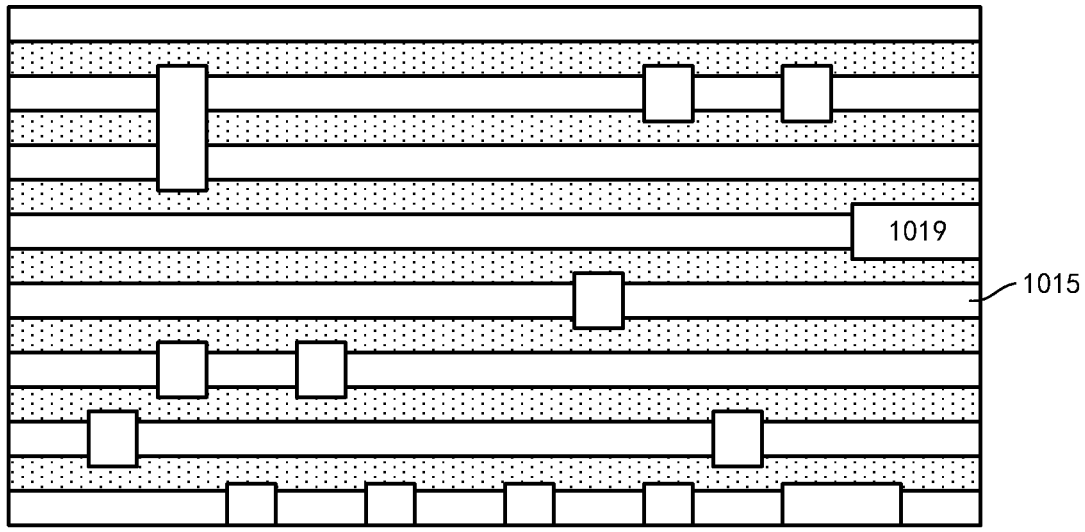

As shown in FIG. 7, a photoresist 1019 may be formed on the interlayer dielectric layer 1011 and the metal wires 1015, and the photoresist 1019 may be patterned (e.g., by exposing and developing) to cover the areas where the conductive vias will be formed, while exposing the rest of the areas.

Here, the width W1 of the photoresist 1019 (that may define the width of the conductive vias in the first the via layer) (the dimension in the longitudinal extension direction of the metal wires, in this example, the horizontal direction in the paper plane in FIG. 7) may be relatively large, so that the interconnection wires in a second interconnection wire layer formed above it may better land on the conductive vias and make better contact with the conductive vias.

Figure 8A:
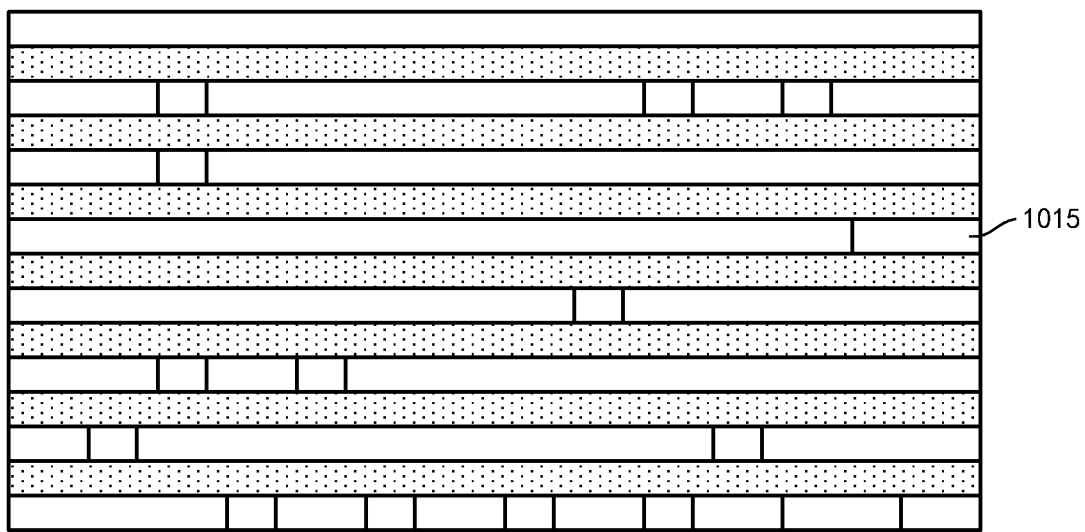
Figure 8B:
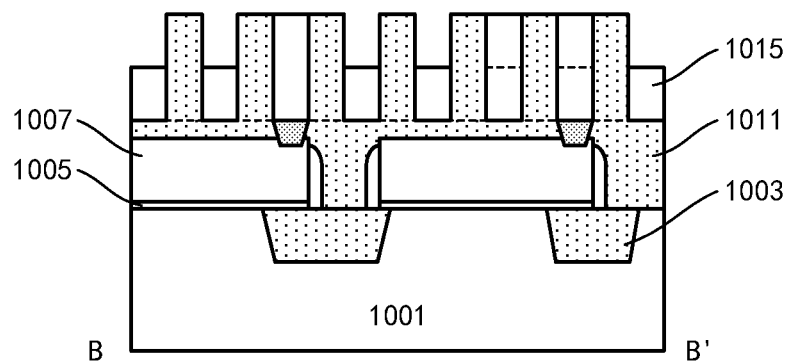
Figure 8C:
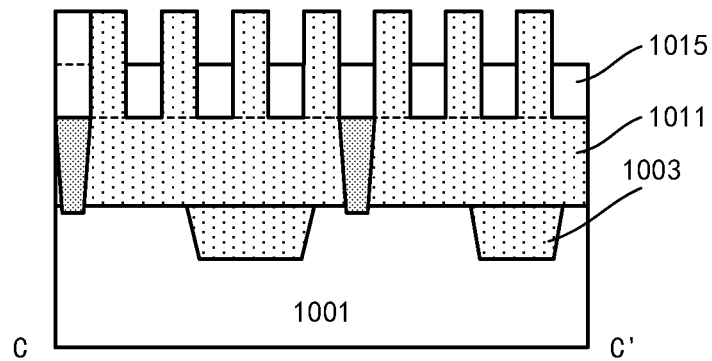

As shown in FIGS. 8(a) to 8 (c), the metal wires 1015 may be selectively etched, such as RIE, by using the photoresist 1019 as an etching mask to form the conductive vias. The etching of the metal wire 1015 may be performed to the middle, e.g., approximately the middle position, of the metal wires in the vertical direction. In this way, a lower part of each metal wire 1015 may continuously extend (to form the interconnection wires in the first interconnection wire layer), and an upper part of at least a part of the metal wires 1015 may be formed into some separated patterns (that may form the conductive vias in the first the via layer, referring to FIG. 8(a)). There may be some metal wires 1015 (e.g., dummy metal wires), an upper part of which is all etched away so that there are no corresponding vias. In FIGS. 8(b) and 8(c), a boundary between the first interconnection wire layer and the first via layer are schematically shown with dotted lines, but they are physically integrated. Afterwards, the photoresist 1019 may be removed.

Since the conductive vias are derived from lithographically formed wires, the minimum spacing between conductive vias may be defined by (e.g., equal to) the minimum line spacing achievable by the lithographic process. In general, the minimum spacing between the conductive vias formed by photolithography is larger than the minimum spacing between the wires.

Currently, each metal wire 1015 in the first interconnection wire layer continuously extends. They may be separated into segments according to the design layout.

Figure 9:
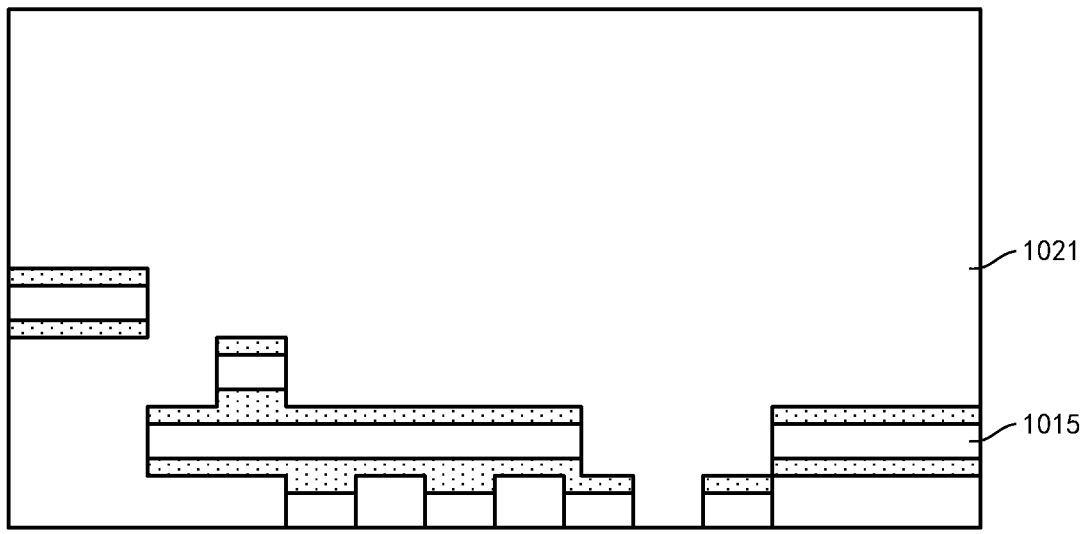

As shown in FIG. 9, a photoresist 1021 may be formed on the interlayer dielectric layer 1011 and the metal wires 1015, and the photoresist 1021 may be patterned to cover regions where the interconnection wires exist in the pattern of the first interconnection wire layer, and expose regions where no interconnection wires exist in the pattern of the first interconnection wire layer.

Figure 10A:
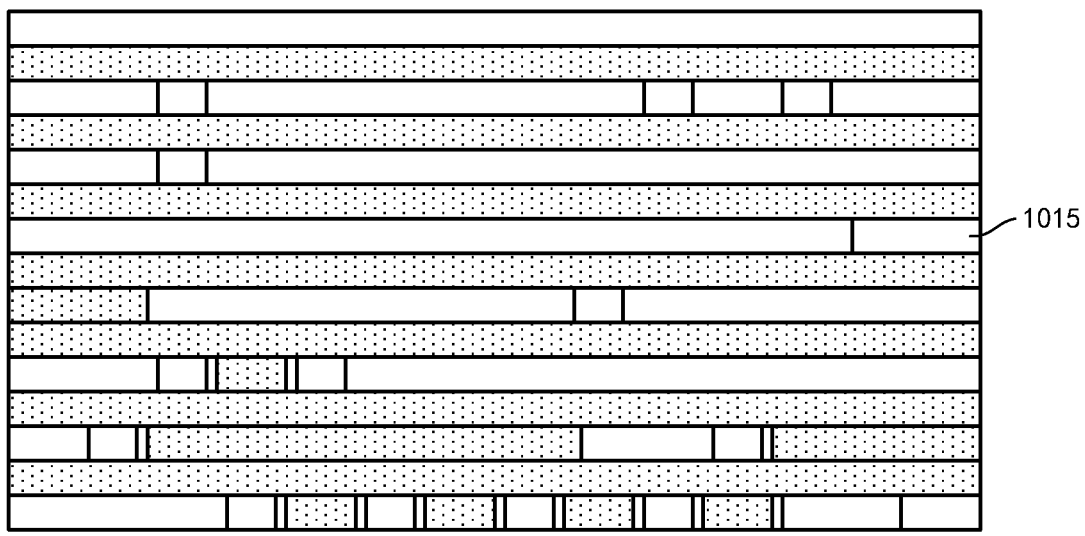

As shown in FIGS. 10(a) to 10 (d), the metal wires 1015 may be selectively etched, such as RIE, by using the photoresist 1021 as an etching mask. Here, the etching on the metal wires 1015 may stop at the underlying interlayer dielectric layer 1011 to cut the metal wires 1015. Therefore, in the first interconnection wire layer, the metal wires 1015 may form some separated metal wire segments to obtain corresponding interconnection wires. Afterwards, the photoresist 1021 may be removed.

In the above example, the conductive vias in the first via layer are patterned first (the etching depth is approximately a half of the thickness of the metal layer), and then the interconnect wires in the first interconnection wire layer are patterned (the etching depth is also approximately a half of the thickness of the metal layer). This is advantageous because the etching depth of each etching process is reduced. However, the present disclosure is not limited thereto. For example, the order of the two patterning processes may be reversed.

Figure 10B:
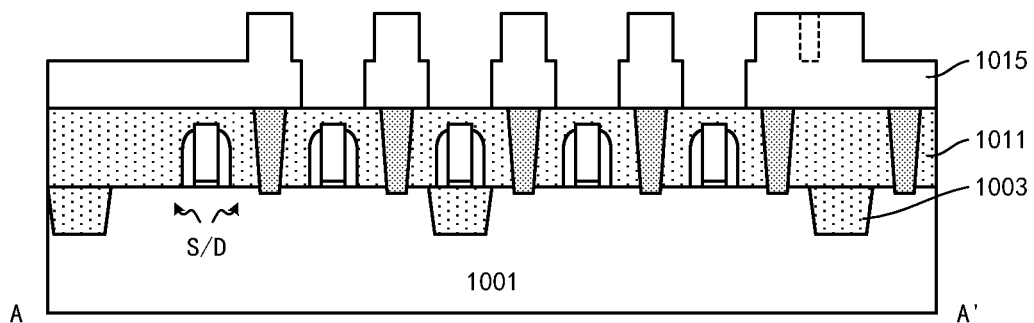

As shown in FIG. 10(b), the lower part of the metal wire 1015 extends on the interlayer dielectric layer 1011 to form the interconnection wire, and the upper part of the metal wire 1015 is a localized pattern on the interconnection wire to form the conductive via. Since the interconnection wire and the conductive via are obtained from the same metal wire 1015, they are integral and self-aligned with each other.

In addition, as shown by the dotted line in the metal wire 1015 on the far right in FIG. 10(b), for adjacent vias on the same interconnection wire, in a case that there is no incorrect electrical connection between interconnection wires in the upper layer, the thickness of the metal wires between the adjacent vias may be reduced, that is, the widths of the adjacent vias may be increased to be integrally connected to each other. In this way, the connection resistance may be reduced.

Figure 10C:
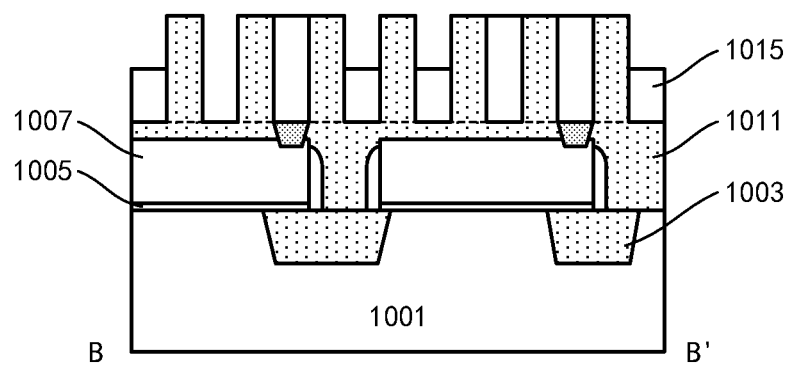
Figure 10D:
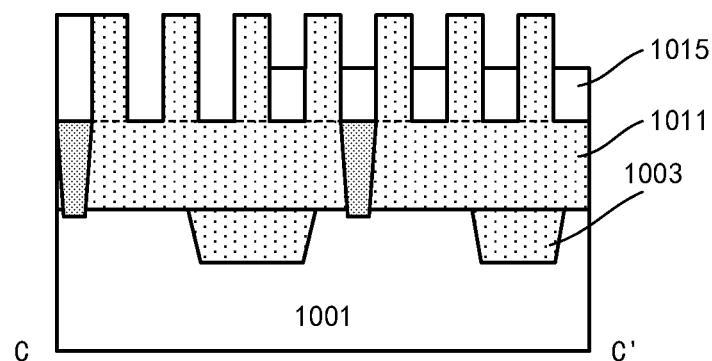
Figure 11A:
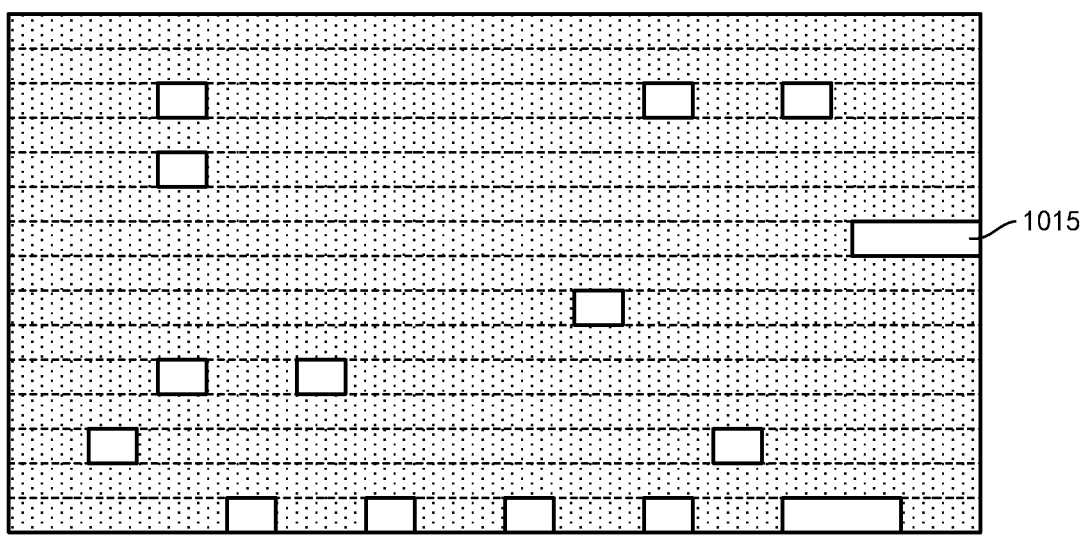
Figure 11B:
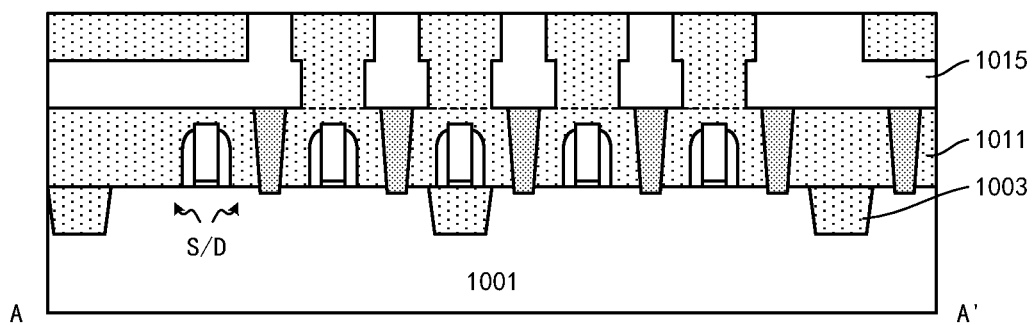
Figure 11C:
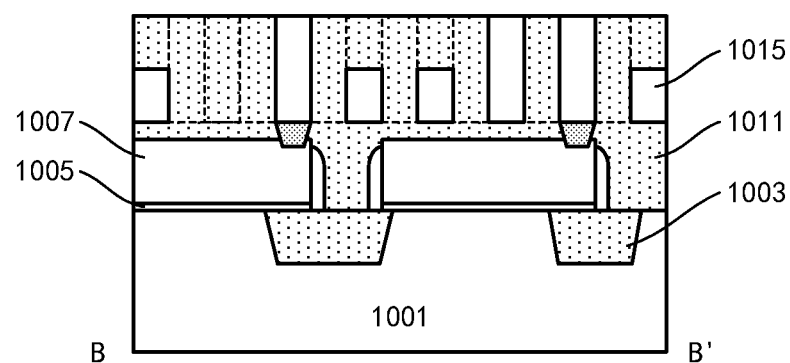
Figure 11D:
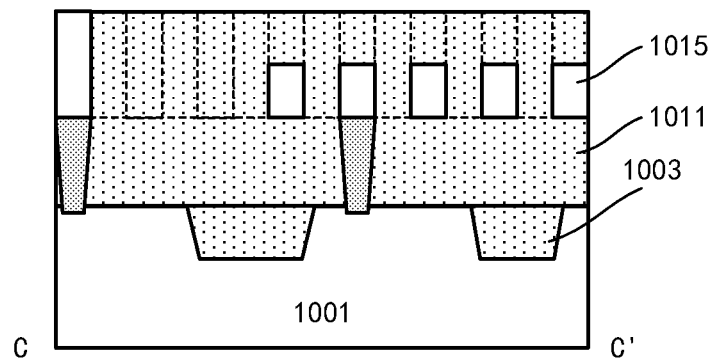

In addition, as shown in FIG. 10(b), in the longitudinal extension direction of the metal wire 1015 (the horizontal direction in the paper plane in FIG. 10(b)), the conductive vias may be located in a local area of the interconnection wire, for example, sidewalls of the vias may be recessed relative to the corresponding sidewalls of the interconnection wires. In addition, as shown in FIGS. 10(c) and 10(d), in a cross-section perpendicular to the longitudinal extension direction of the metal wire 1015, the sidewalls of the conductive vias and the corresponding sidewalls of the interconnection wires may be substantially coplanar.

Due to the above etching on the metal wires 1015, gaps are formed in the interlayer dielectric layer 1011. These gaps may be filled with a dielectric material as shown in FIGS. 11(a) to 11(d). This may be performed by deposition followed by etching back or planarization as described above. The deposited dielectric material may be the same as or different from the previous interlayer dielectric layer 1011. Here, the deposited dielectric material and the previous interlayer dielectric layer are still shown integrally as 1011, and a possible boundary between them is schematically shown with a dashed line. According to other embodiments, a thin layer may be formed, e.g., by deposition, for diffusion barrier, protection, or etch stop purposes prior to deposition of the dielectric material.

Figure 12A:
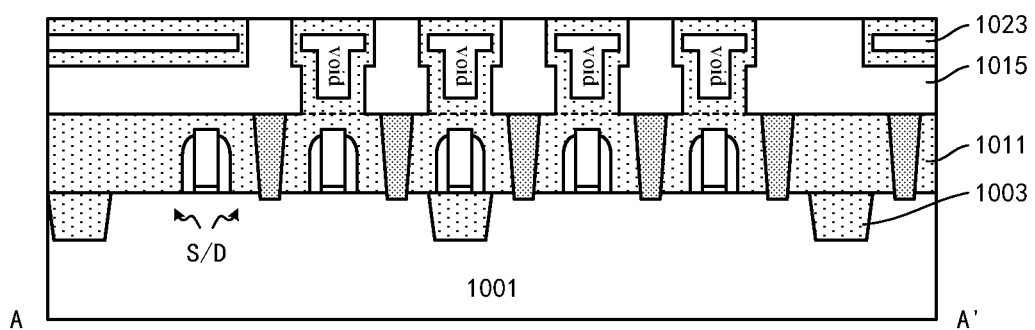
Figure 12B:
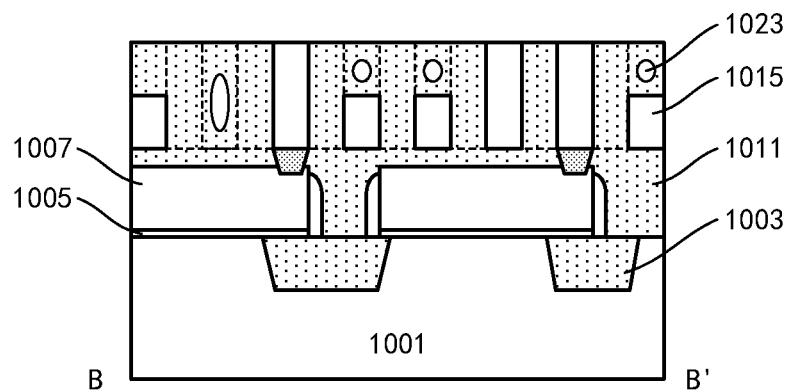
Figure 12C:
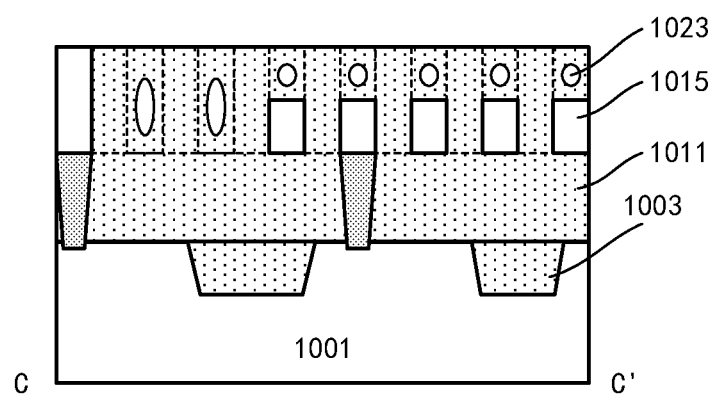

Similarly, as described above, due to the small gap to be filled, hollows or voids 1023 may be formed when the dielectric material is deposited, as shown in FIGS. 12(a) to 12(c). The hollows or voids 1023 may vary according to the shape of the respective gap. In addition, as described above, by adjusting the deposition process, the position of the hollows or voids 1023 in the vertical direction may be adjusted.

Figure 13A:
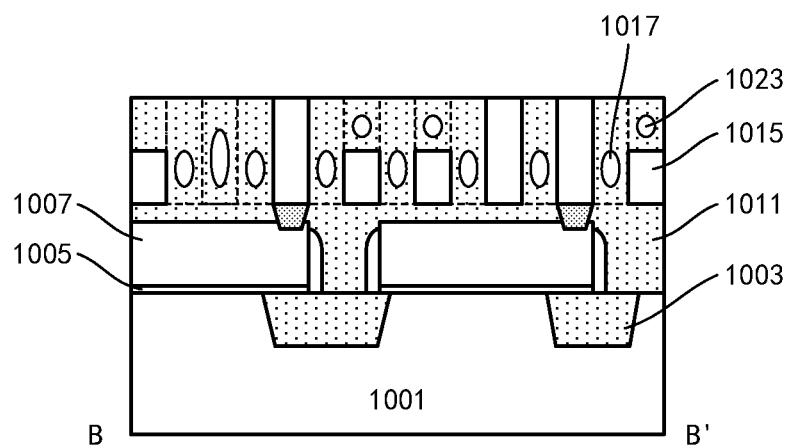
Figure 13B:
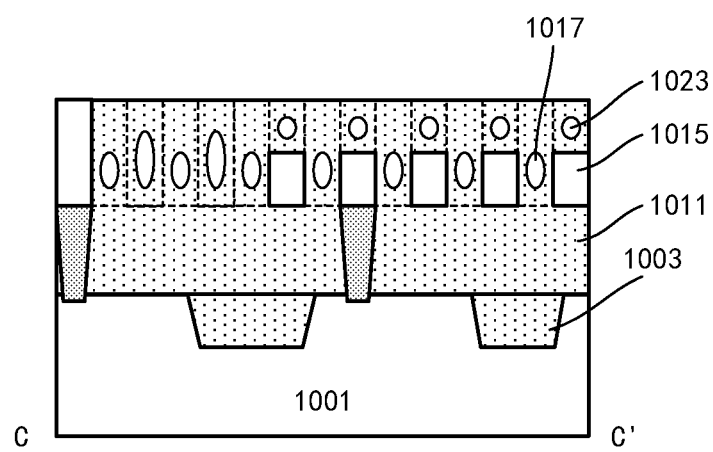

In addition, FIGS. 13(a) and 13(b) show the case where hollows or voids are formed when the gaps in the interlayer dielectric layers are filled two times. That is, in the example shown in FIGS. 13(a) and 13(b), the hollows or voids 1017 and the hollows or voids 1023 as described above are combined.

Through the above process, the first interconnection wire layer and the first via layer are formed. Next, through the same process, various interconnection wire layers and via layers in the upper layer of the metallic stack may be formed.

However, the present disclosure is not limited thereto. Hereinafter, a preparing method according to another embodiment of the present disclosure will be described in conjunction with the second interconnection wire layer and the second via layer. The method described below may be used alone or in combination with the method as described above.

As shown in FIGS. 14(a) to 14(d), as described above in conjunction with FIG. 2, a metal layer 1025 may be formed. The metal layer 1025 may include the same or different metal material as the metal layer 1015. Similarly, the metal layer 1025 may have a thickness for both the second interconnection wire layer and the second via layer in the metallic stack, e.g., about 10-200 nm.

The metal layer 1025 may then be patterned into a series of metal wires as described above in conjunction with FIGS. 3(a)-3(c). In this example, instead of patterning the metal layer 1025 into continuously extending metal wires, the metal layer 1025 may be patterned directly according to the pattern of the second interconnection wire layer. Thus, the metal layer 1025 may be patterned into a series of metal wire segments. That is, here, the metal wire cutting process described above in conjunction with FIGS. 9 and 10(a) to 10(d) is combined to be performed together with the metal layer patterning, so that a separate cutting lithography process is not required. In addition, due to this patterning manner, the metal wire segments may not be limited to straight line segments, but may include zigzag line segments.

Figure 14A:
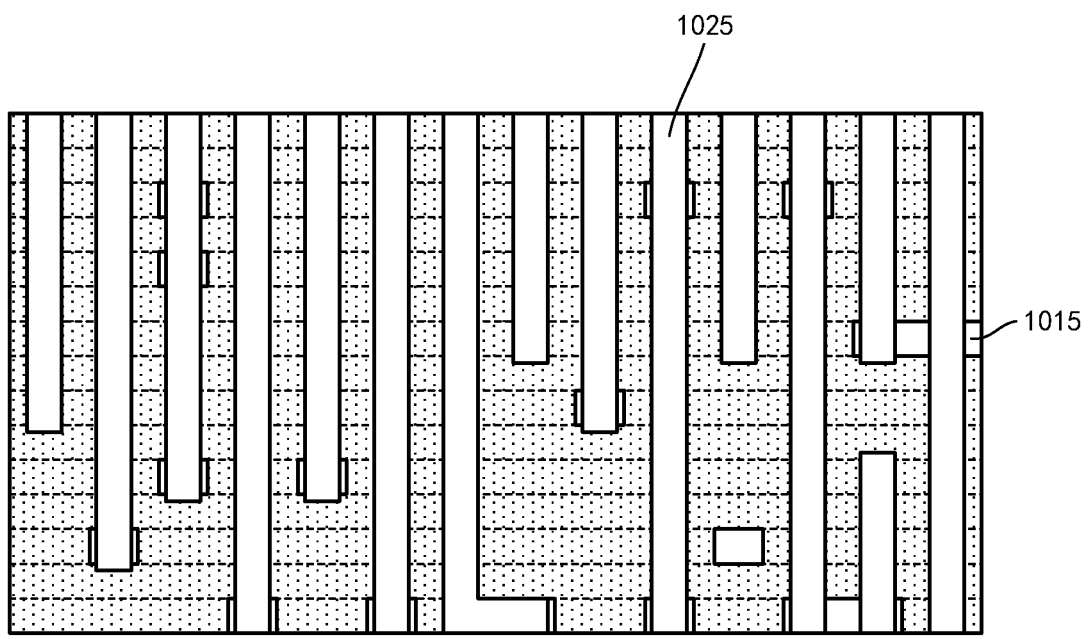
Figure 14B:
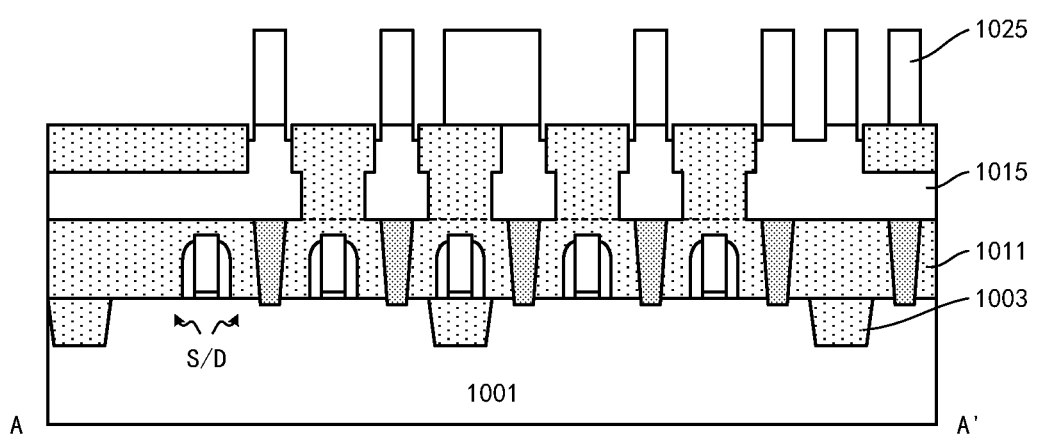
Figure 14C:
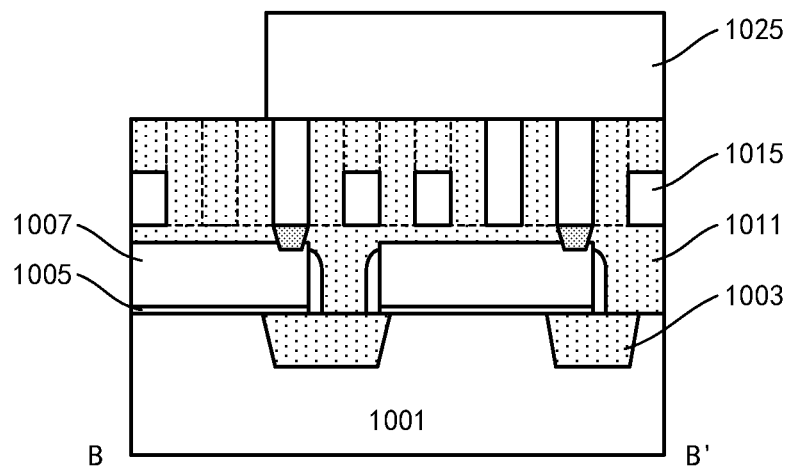
Figure 14D:
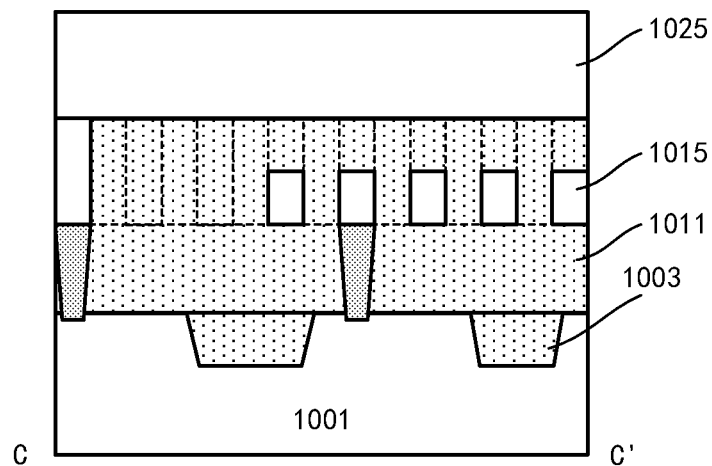

Additionally, when the metal layer 1025 is etched, overetching of the underlying metal layer 1015 may occur. Then, as shown in FIG. 14(b), the width of the upper part of the conductive vias in the first the via layer may be reduced, and is approximately equal to the line width of the metal wire segment 1025 formed thereon. In addition, as shown in FIG. 14(b), the line width W2 of the metal wire segment 1025 (the dimension in the horizontal direction in the paper plane in FIG. 14(b)) may be relatively small, and be smaller than the width W1 (dimension in the horizontal direction in the paper plane in FIG. 14(b)) of the conductive vias in the first via layer (without considering its upper part, the width of which may be reduced due to the above-mentioned over-etching), so that the metal wire segment 1025 (that is subsequently formed into the interconnection wires in the second interconnection wire layer) may land better on the conductive vias and make better contact with the conductive vias.

Another interlayer dielectric layer may be formed on the interlayer dielectric layer 1011 to fill the gaps between the metal wire segments 1025. Another interlayer dielectric layer may include dielectric materials such as silicon oxide, silicon oxycarbide, other low-k dielectric materials, and the like.

The another interlayer dielectric layer may be formed as follows.

Figure 15A:
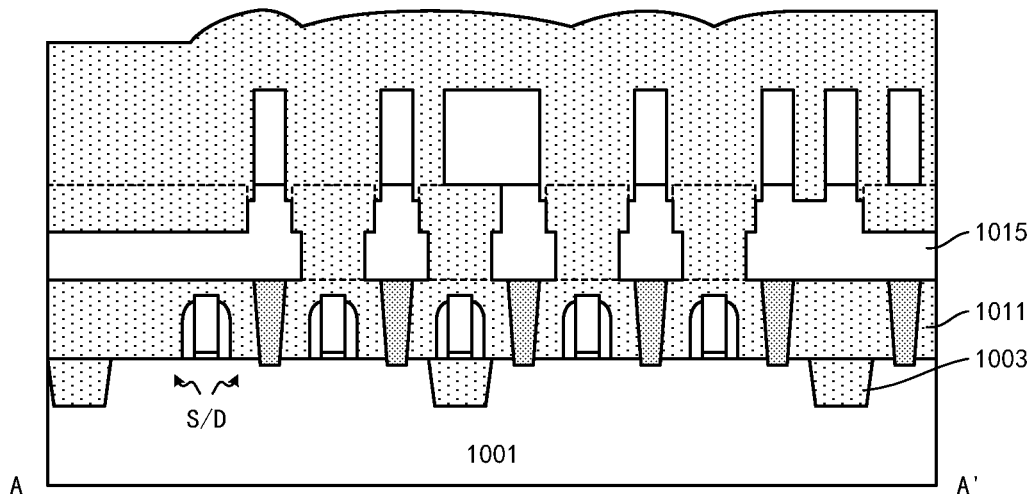
Figure 15B:
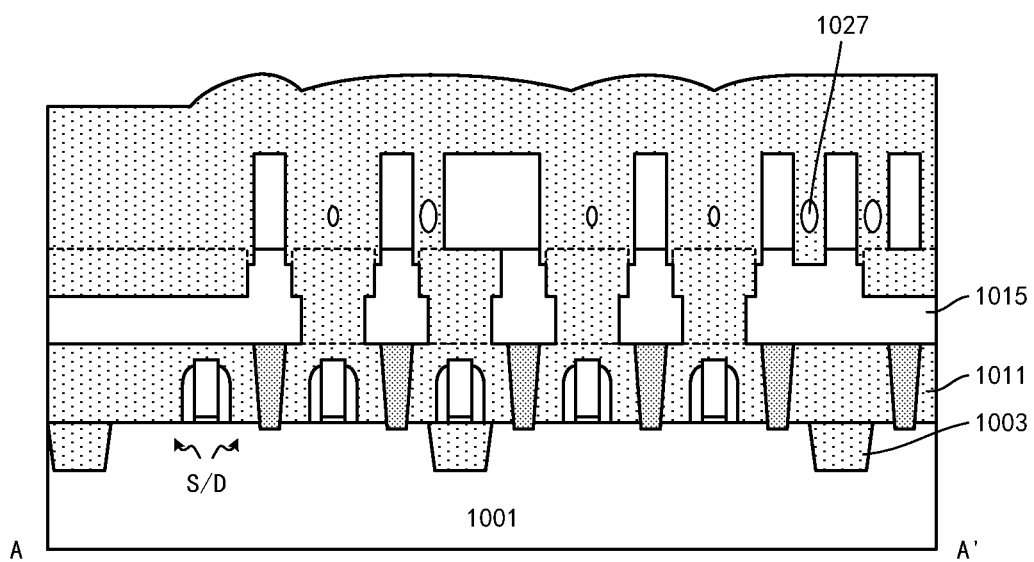

As shown in FIG. 15(a), a dielectric material may be deposited, for example, by CVD or ALD, to cover the metal wire segments 1025. Here, the deposited dielectric material and the previous interlayer dielectric layer 1011 may include the same material, and thus may be shown integrally as 1011, and a possible boundary between them is schematically shown with a dashed line. Of course, they may also include different materials.

Alternatively, as described above, as shown in FIG. 15(b), hollows or voids 1027 may be formed between metal wire segments 1025 when the dielectric material is deposited. In this example, since the metal wire segments have the pattern of the second interconnecting line layer, the density of the metal wire segments in a local area may be lower, or the gap between the metal wire segments may be larger. In these regions, it is difficult to form the hollows or voids.

Figure 16:
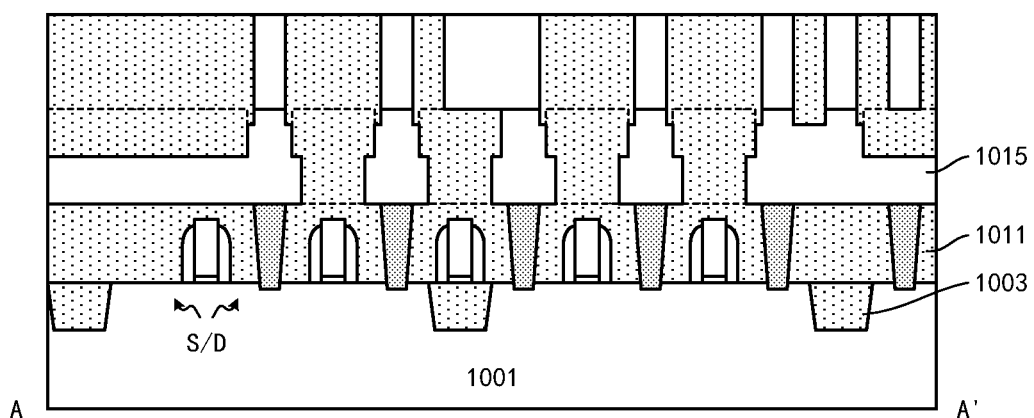

Then, as shown in FIG. 16, the deposited dielectric material may be etched back or planarized (for example, by CMP) and stopped at the top surface of the metal wire segments 1025. The etching-back process may use ALE for good process control.

Afterwards, conductive vias in the second via layer may be formed on the upper part of the metal wire segment 1025 according to the processes as described above in conjunction with FIGS. 7 and 8(a) to 8(c). Thus, the lower part of the metal wire segments 1025 may form the interconnection wire in the second interconnection wire layer. The gaps in the interlayer dielectric layer 1011 may then be filled with a dielectric material according to the process as described above in connection with FIGS. 11(a) to 11(d). In this way, the second interconnection wire layer and the second via layer are formed.

The metallic stacks according to embodiments of the present disclosure may be applied to various electronic devices. Accordingly, the present disclosure also provides an electronic device including the above-described metallic stacks. The electronic devices may also include components such as display screens and wireless transceivers. Such electronic devices are, for example, smart phones, computers, tablet computers (PCs), wearable smart devices, power banks, and the like.

According to the embodiments of the present disclosure, a method of preparing a system on a chip (SoC) is also provided. The method may include the methods as described above. In particular, a variety of devices may be integrated on the chip, at least some of which are prepared according to the methods of the present disclosure.

In the above description, technical details such as patterning and etching of each layer are not described in detail. However, those skilled in the art should understand that various technical means may be used to form layers, regions, etc. of desired shapes. In addition, in order to form the same structure, those skilled in the art may also design methods that are not exactly the same as those described above. Additionally, although the various embodiments have been described above separately, this does not mean that the measures in the various embodiments cannot be used in combination.

Embodiments of the present disclosure have been described above. However, these embodiments are merely for illustrative purposes, and are not intended to limit the scope of the present disclosure. The scope of the present disclosure shall be defined by appended claims and their equivalents. Without departing from the scope of the present disclosure, those skilled in the art can make various substitutions and modifications, and these substitutions and modifications should all fall within the scope of the present disclosure.

What is claimed is:

1. A metallic stack, comprising at least one interconnection wire layer and at least one via layer alternately arranged on a substrate, wherein at least one pair of interconnection wire layer and via layer which are adjacent in the metallic stack comprise:
   interconnection wires in the interconnection wire layer; and
   conductive vias in the via layer,
   wherein, the interconnection wire layer is closer to the substrate than the via layer; and
   at least a part of the interconnection wires is integrated with the conductive vias on the at least a part of the interconnection wires, wherein a first dielectric layer is filled between the interconnection wires in the interconnection wire layer, the first dielectric layer further extends between the conductive vias in the via layer, a second dielectric layer is filled in a region that is not filled by the first dielectric layer and is between the conductive vias in the via layer, and a partial interface between the second dielectric layer and an extension portion of the first dielectric layer is self-aligned with a sidewall of a corresponding interconnection wire in the interconnection wire layer.

2. The metallic stack of claim 1, wherein the conductive vias on the at least a part of the interconnection wires and the at least a part of the interconnection wires are formed of the same material.

3. The metallic stack of claim 1, wherein peripheral sidewalls of the conductive vias do not extend beyond peripheral sidewalls of the at least a part of the interconnection wires.

4. The metallic stack of claim 3, wherein sidewalls of the at least a part of the interconnection wires in a longitudinal extension direction are substantially coplanar with at least a lower part of corresponding sidewalls of the conductive vias.

5. The metallic stack of claim 1, wherein the interconnection wires and the conductive vias comprise metal and are in direct contact with the first dielectric layer or the second dielectric layer around the interconnection wires and the conductive vias.

6. The metallic stack of claim 5, wherein the metal comprises ruthenium (Ru), molybdenum (Mo), rhodium (Rh), platinum (Pt), iridium (Ir), nickel (Ni), cobalt (Co) or chromium (Cr).

7. The metallic stack of claim 1, wherein the first dielectric layer and/or the second dielectric layer comprises hollows or voids located between the interconnection wires and/or the conductive vias.

8. The metallic stack of claim 1, wherein the interconnection wires in the interconnection wire layer extend in the same direction.

9. The metallic stack of claim 8, wherein there are at least one pair of interconnection wire layers which are adjacent in an up-down direction, and the interconnection wires in the pair of interconnection wire layers extend in directions orthogonal to each other.

10. The metallic stack of claim 1, wherein a width of at least one of the conductive vias is larger than a width of at least one of the interconnection wires on the conductive vias.

11. The metallic stack of claim 10, wherein a width of an upper part of at least one of the conductive vias is substantially equal to a width of at least one of the interconnection wires on the conductive vias, and a width of a lower part of at least one of the conductive vias is larger than a width of at least one of the interconnection wires on the conductive vias.

12. The metallic stack of claim 1, wherein, in a cross-section perpendicular to a longitudinal extension direction of the interconnection wires, the conductive vias and the interconnection wires are tapered from bottom to top.

13. The metallic stack of claim 1, wherein the minimum spacing between the conductive vias is defined by the minimum line spacing achievable by a photolithographic process.

14. An electronic device comprising the metallic stack of claim 1.

15. The electronic device of claim 14, wherein the electronic device comprises a smart phone, a computer, a tablet computer, an artificial intelligence device, a wearable device, or a power bank.

* * * * *